United States Patent
Shankar et al.

(10) Patent No.: US 8,451,016 B2
(45) Date of Patent: May 28, 2013

(54) DEVICE AND METHOD FOR TESTING MAGNETIC SWITCHES AT WAFER-LEVEL STAGE OF MANUFACTURE

(75) Inventors: Ravi Shankar, Singapore (SG); Olivier Le Neel, Irving, TX (US)

(73) Assignee: STMicroelectronics Pte Ltd., Singapore (SG)

( * ) Notice: Subject to any disclaimer, the term of this patent is extended or adjusted under 35 U.S.C. 154(b) by 545 days.

(21) Appl. No.: 12/650,257

(22) Filed: Dec. 30, 2009

(65) Prior Publication Data

US 2011/0156712 A1 Jun. 30, 2011

(51) Int. Cl.
*G01R 31/20* (2006.01)
*G01R 31/00* (2006.01)
*G01R 1/073* (2006.01)

(52) U.S. Cl.
CPC ........ *G01R 1/07378* (2013.01); *G01R 1/07342* (2013.01)
USPC .................................. 324/754.11; 324/756.03

(58) Field of Classification Search
CPC .................. G01R 1/07378; G01R 1/07342
USPC . 324/501, 529, 754.1–754.14, 754.17–754.2, 324/755.01–756.07
See application file for complete search history.

(56) References Cited

U.S. PATENT DOCUMENTS

| | | | | |
|---|---|---|---|---|
| 6,232,790 B1 * | 5/2001 | Bryan et al. | ............. | 324/754.07 |
| 6,401,330 B2 * | 6/2002 | Baldwin | ......................... | 29/741 |
| 6,459,272 B1 * | 10/2002 | Yamashita | ..................... | 324/529 |
| 6,686,993 B1 * | 2/2004 | Karpman et al. | .......... | 356/237.1 |
| 7,005,876 B2 * | 2/2006 | Wei et al. | ................. | 324/750.23 |
| 7,345,470 B2 * | 3/2008 | Suzuki | ......................... | 324/202 |
| 8,008,936 B2 * | 8/2011 | Clarke et al. | ............ | 324/754.11 |
| 8,263,934 B2 * | 9/2012 | Yamazaki et al. | ............ | 250/307 |
| 8,304,725 B2 * | 11/2012 | Komuro et al. | ............... | 250/310 |
| 2006/0052957 A1 * | 3/2006 | Hidehira | ......................... | 702/58 |
| 2006/0284629 A1 * | 12/2006 | Wei et al. | ...................... | 324/754 |

* cited by examiner

*Primary Examiner* — Joshua Benitez Rosario
(74) *Attorney, Agent, or Firm* — Seed IP Law Group PLLC

(57) ABSTRACT

A testing mechanism for testing magnetically operated microelectromechanical system (MEMS) switches at a wafer level stage of manufacture includes an electromagnetic fixture configured to be received in a standard probe ring. The electromagnetic fixture is rotatable, relative to the probe ring, to permit adjustment of orientation of a generated magnetic field relative to the MEMS devices of a subject wafer. The testing mechanism also includes a probe card with probes positioned to contact test pads on the subject wafer. During operation, the probe card is positioned over the wafer to be tested, with the test probes in electrical contact with respective contact pads of the wafer, and the electromagnetic fixture is positioned above the probe card. An electrical potential is applied across the switches on the subject wafer, and the electromagnetic fixture is energized at selected levels of power and duration. Current flow across each switch is measured to determine one or more of: open circuit contact resistance, closed circuit contact resistance, response time, response to switching magnetic field, frequency response, current capacity, critical dimensions, critical angles of magnetic field orientation, etc. Wafer level testing enables rejection of non-compliant switches before the cutting and packaging levels of manufacture.

33 Claims, 10 Drawing Sheets

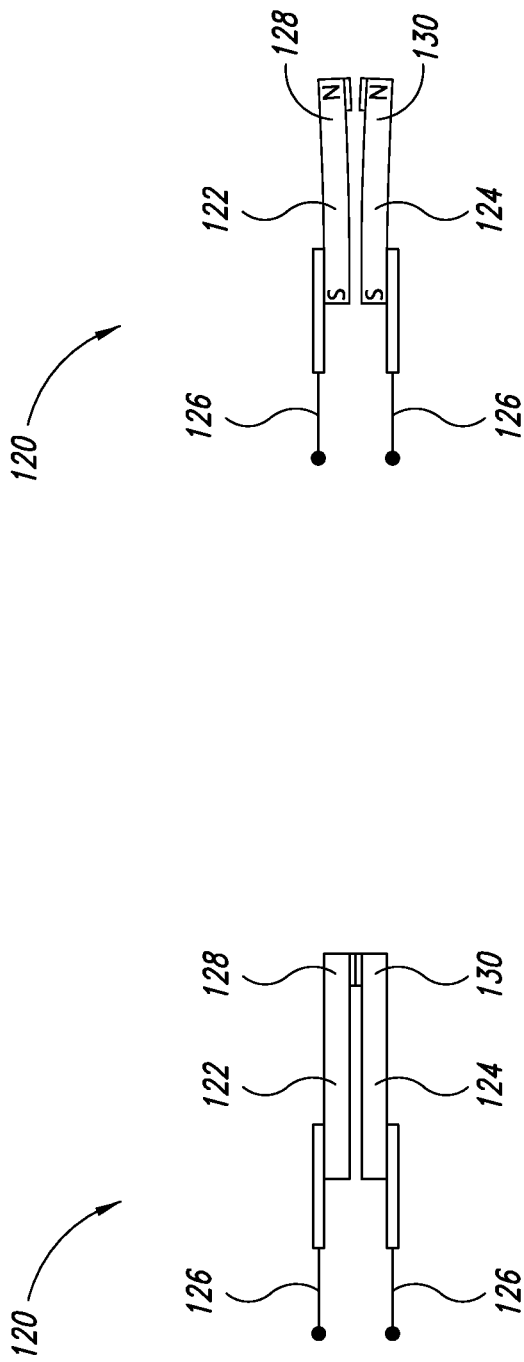

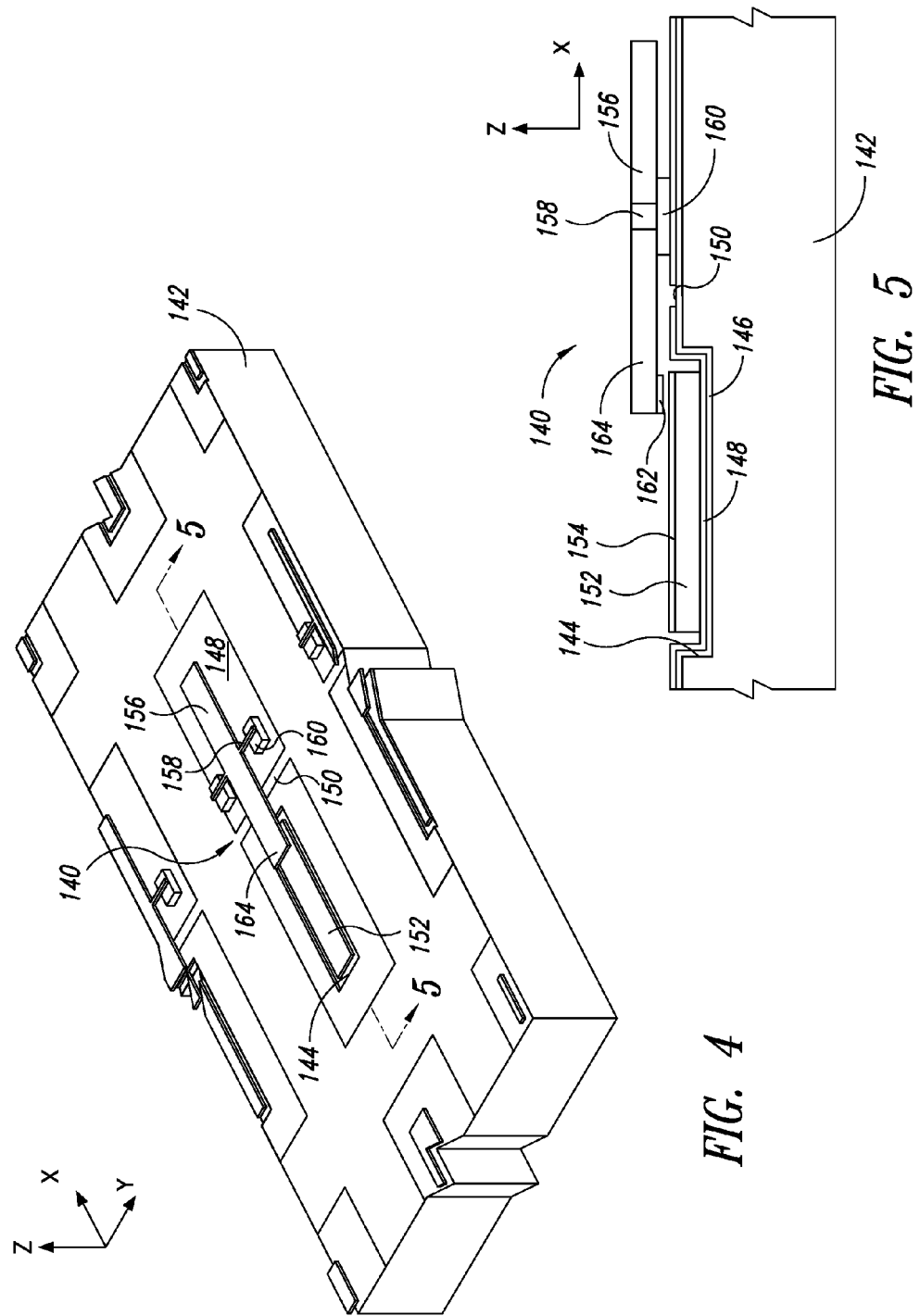

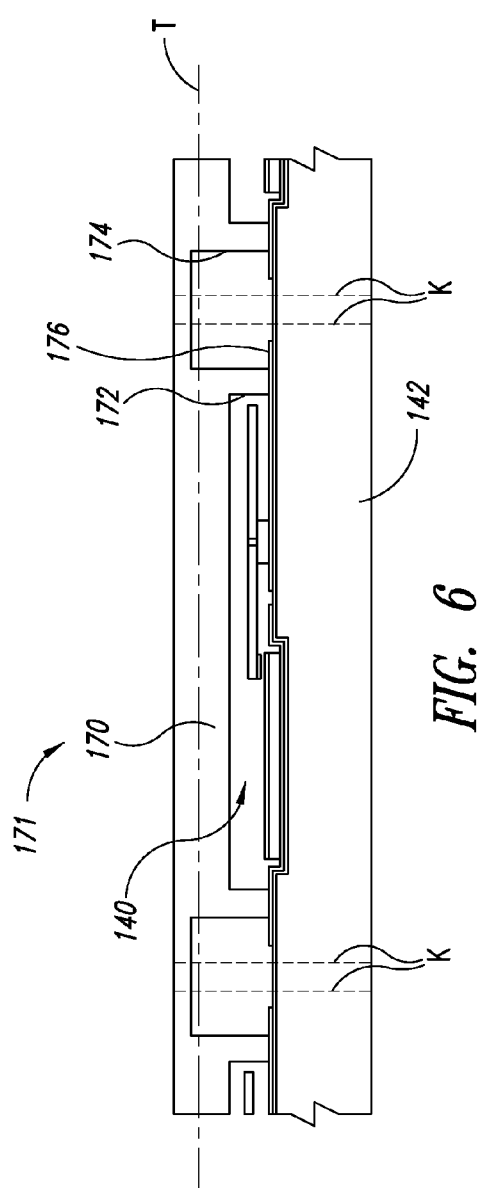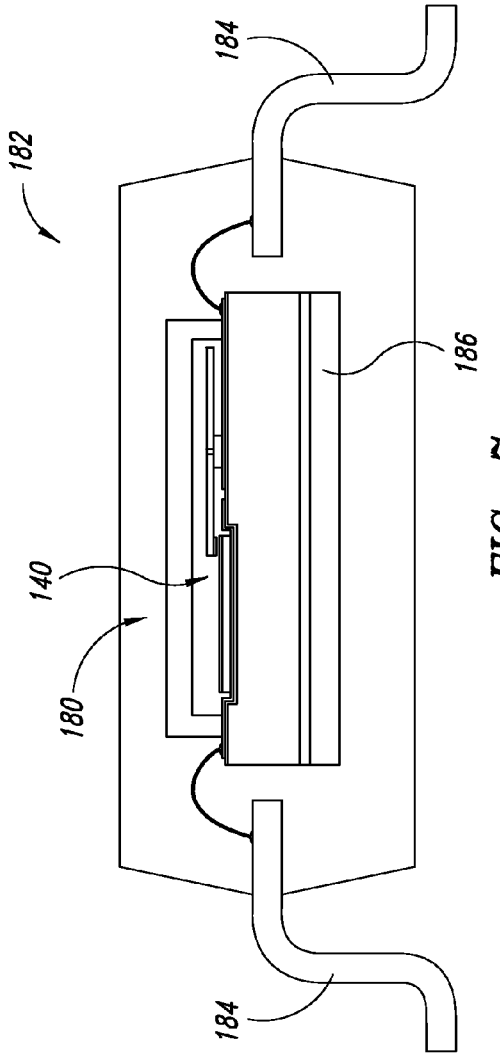

DEVICE AND METHOD FOR TESTING MAGNETIC SWITCHES AT WAFER-LEVEL STAGE OF MANUFACTURE

BACKGROUND

1. Technical Field

The principles of the disclosed invention are related to the testing of magnetically actuated switches formed on semiconductor substrates, and in particular, to the testing o such switches at the wafer level of manufacture, before singulation and packaging.

2. Description of the Related Art

A magnetic switch is an electrical switch that is activated by magnetic attraction or repulsion. FIG. 1A is a schematic view of a well known prior art magnetic switch 100 that includes first and second contact plates 102, 104 made from a ferromagnetic material such as, for example, nickel-iron. The first and second contact plates each lie parallel to an X axis, and are offset with respect to each other so that only their respective free ends 108, 110 overlap, and are spaced a small distance apart. Each of the first and second contact plates 102, 104 has a contact terminal 106, by which the switch 100 is coupled to an electrical circuit.

The magnetic switch 100 is a normally-open type switch that closes when exposed to a magnetic force of sufficient strength. FIG. 1B shows the switch 100 in proximity to a magnet 112, with the magnetic force of the magnet depicted as lines 114 that arc from the north pole to the south pole of the magnet. The magnetic north and south poles of the magnet 112 define a polar axis P of the magnet. The magnet 112 is shown positioned near the switch 100 with its polar axis P lying substantially parallel to the X axis, and thus also parallel to the first and second contact plates 102, 104. When the magnet 112 and the switch 100 are brought into close proximity, the ferromagnetic material of the first and second contact plates 102, 104 is exposed to the magnetic force, which induces a magnetic polarity in the first and second contact plates 102, 104 that is opposite the polarity of the magnet 112. Thus, when the magnet 112 has a north pole on the left and a south pole on the right, each of the first and second contact plates 102, 104 has a north pole on the right and a south pole on the left. Because of the relative positions of the first and second contact plates 102, 104, the left-hand end 108 of the first contact plate 102 is adjacent to the right-hand end 110 of the second contact plate 104. Under the influence of the magnet 112, the end 108 of the first contact plate 102 is polarized as a south pole, while the end 110 of the second contact plate 104 is polarized as a north pole. Accordingly, as the first and second contact plates 102, 104 flex slightly, the ends 108, 110 of the first and second contact plates are drawn together by magnetic attraction, thereby closing the switch 100.

If the magnet 112 is positioned so that its polar axis P is perpendicular to the X axis of the switch 100, as shown in FIG. 2A, the direction or polarity of the magnetic force will be balanced across the contact plates 102, 104, so that the contact plates will not become polarized as described with reference to FIG. 1A. Thus, in the position shown in FIG. 2A, the switch will be in the open position. Rotation of the magnet 112 around a Y axis that lies perpendicular to the X axis brings the magnet toward the parallel position shown in FIG. 1B. The Y axis is perpendicular to the page, and not shown, but can be understood from the axis markings on FIG. 1A. As the magnet 114 is rotated away from the perpendicular position, as shown in FIG. 2B, at some angle of rotation, sufficient polarity will be induced in the contact plates 102, 104 to cause the switch 100 to close.

FIGS. 3A and 3B show a normally-closed type magnetic switch 120 that includes first and second contact plates 122, 124, each having a contact terminal 126. The first and second contact plates 122, 124 lie parallel to each other and are substantially coextensive. As shown in FIG. 3A, ends 128, 130 of the first and second contact plates 122, 124 are in electrical contact with each other under normal conditions. FIG. 3B shows the magnetic switch 120 in an actuated condition. As described above with reference to the magnetic switch 100, when the first and second contact plates 122, 124 are exposed to the magnetic energy of a magnet oriented as shown in FIG. 1B, they become magnetically polarized in a similar fashion. However, because the first and second plates 122, 124 are coextensive, their respective north and south poles are directly opposite each other. The magnetic repulsion between the ends 128, 130 causes the first and second contact plates to flex away from each other, opening the switch 120.

Turning now to FIGS. 4 and 5, a magnetic switch 140 is shown, which is one of a large plurality of switches formed on a semiconductor wafer 142 using methods that are well known in the art. FIG. 4 shows a perspective view of a portion of the wafer 142, while FIG. 5 is a cross-sectional view of the switch 140, taken along lines 5-5 of FIG. 4. For the sake of clarity, it will be assumed that any magnetic switches discussed hereafter are positioned so that their longitudinal axes lie parallel to the X axis, and that the substrate surfaces on which they are positioned lie parallel to a plane defined by the X and Y axes, with the Z axis being perpendicular to that plane.

The switch 140 is one of a broad class of devices that are commonly referred to as microelectromechanical systems (MEMS) devices. The particular structure of the switch 140 is merely exemplary, inasmuch as there are a number of different configurations for MEMS type magnetic switches. The switch 140 includes a cavity 144 formed in the upper surface of the wafer 142, over which a dielectric layer 146 is formed. A conductive layer 148 is positioned over the dielectric layer 146 and a channel 150 is provided in the conductive layer 148 to electrically isolate the two sides of the switch 140. A first contact plate 152 of ferromagnetic material is positioned in the cavity 144, with a layer of conductive material 154 positioned on an upper surface thereof. A second ferromagnetic-material contact plate 156 is suspended over the surface of the substrate 142 by a pair of springs 158 extending from the second contact plate 156 to respective anchors 160 positioned on the surface of the substrate 142. Finally, a segment of a conductive layer 162 is positioned on an underside of an end 164 of the second contact plate 156, where it will touch the upper surface of the first contact plate 152 when the switch 140 is activated.

The ferromagnetic material of the first and second contact plates 152, 156 behaves substantially as described with reference to the first and second contact plates 102, 104 of FIGS. 1A and 1B. When the switch 140 is activated, the second contact plate 156 rotates around an axis defined by the springs 158 to bring its end 164 into contact with the upper surface of the first contact plate 152. The material of the conductive layers 148, 154, and 162 is selected to resist formation of oxides that could interfere with a good electrical contact upon closing, such as, e.g., gold. There may be as many as 6,000 to 8,000 switches formed on a single wafer.

During the manufacturing process, as shown in FIG. 6, following the formation of the switches on the semiconductor material wafer 142, a second wafer 170 is positioned above the first wafer 142 and bonded to the surface thereof, to form a composite wafer 171. The second wafer 170 includes a first plurality of cavities 172 in positions that correspond to each of the switches 140 so that each of the switches is hermetically sealed within an enclosed chamber. A second plurality of cavities 174 is formed in positions corresponding to contact terminals 176 on the first wafer 142. After the second wafer 170 is bonded to the first wafer 142, the second wafer is thinned, by removing a portion of the upper surface, at least far enough to open the second cavities 174, as indicated by dotted line T. Thereafter, the composite wafer 171 is cut into individual dice 180, which removes material between the kerf lines K of FIG. 6. Each die 180 now contains a single, hermetically sealed, magnetically operated switch, which is thereafter packaged according to requirements of a particular application.

In FIG. 7, the exemplary die 180 is mounted to a paddle 186 of a lead frame and electrically coupled via wire bonding to leads 184, all of which is encapsulated within a flat-pack type package 182. Following the packaging step, each switch 140 is tested for conformance to a specific set of performance parameters.

BRIEF SUMMARY

According to one embodiment, a testing mechanism is provided, for testing magnetically operated micro-electromechanical system (MEMS) switches at a wafer level stage of manufacture. The mechanism includes an fixture configured to be supported in a probe ring of a wafer prober. The fixture supports an electromagnetic field generator that can be rotated, relative to the probe ring, to permit adjustment of orientation of a generated magnetic field relative to the MEMS devices of a subject wafer. The testing mechanism also includes a probe card with probes positioned to contact test pads on the subject wafer. During operation, the probe card is positioned over the wafer to be tested, with the test probes in electrical contact with respective contact pads of the wafer, and the electromagnetic fixture is positioned above the probe card. An electrical potential is applied across the switches on the subject wafer, and the electromagnetic fixture is energized at selected levels of power and duration. Current flow across each switch is measured to determine one or more of: open circuit contact resistance, closed circuit contact resistance, response time, response to switching magnetic field, frequency response, current capacity, critical dimensions, critical angles of magnetic field orientation, etc. Wafer level testing enables rejection of non-compliant switches before the cutting and packaging levels of manufacture.

According to another embodiment, a method is provided for testing various parameters of one or more magnetically operated MEMS devices at the wafer stage.

BRIEF DESCRIPTION OF THE SEVERAL VIEWS OF THE DRAWINGS

FIGS. 1A-3B are schematic views of prior art magnetically actuated switches illustrating the principle of operation.

FIG. 4 is a perspective view showing one of a plurality of magnetic switches positioned on a semiconductor wafer, according to known principles of the prior art.

FIG. 5 is a cross-sectional view of the switch of FIG. 4, taken along lines 5-5 of FIG. 4.

FIGS. 6 and 7 show the switch of FIG. 4 at later manufacturing stages.

DETAILED DESCRIPTION

Most semiconductor devices undergo wafer-level testing prior to singulation and packaging of the individual chips. Wafer-level testing typically involves testing the electronic function of each of the individual devices on a wafer, either one at a time, or in larger groups of devices. For example, on a memory chip, each address location on the chip is tested, as well as the logic circuits, power regulators, buffering circuits, etc. At this level, many electronic faults in such a device can be detected and repaired prior to packaging, and if repair is not possible, that particular device can be noted, so that after the wafer is cut, the defective devices can be discarded before being packaged. In a similar fashion, many, but not all, MEMS devices also undergo wafer-level testing prior to packaging. There are currently no known wafer-level test systems or methods for testing magnetically operated MEMS devices, including switches such as those described with reference to FIGS. 4-7. According to various embodiments of the invention, a device and a method are provided for testing magnetic switches at the wafer level.

Figure 1A:
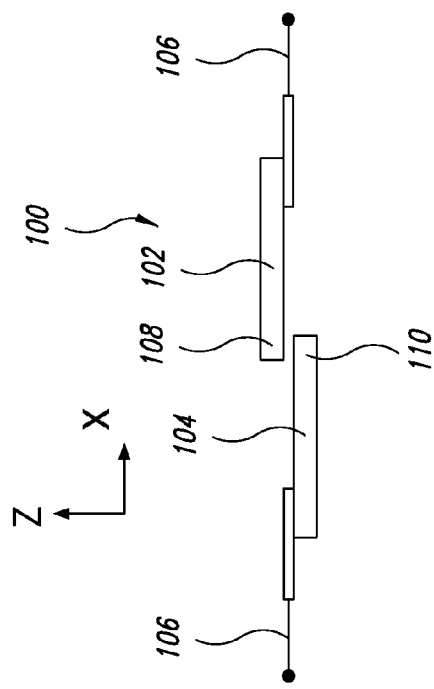
Figure 1B:
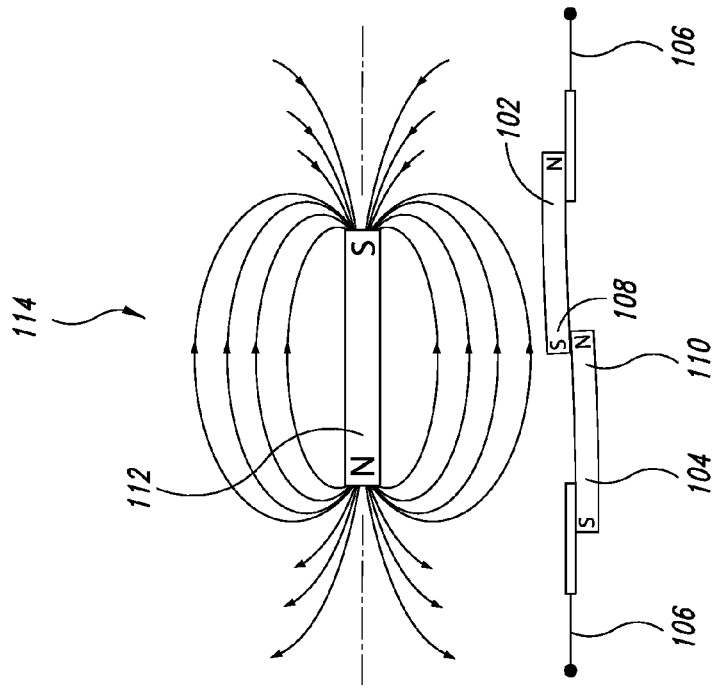
Figure 2A:
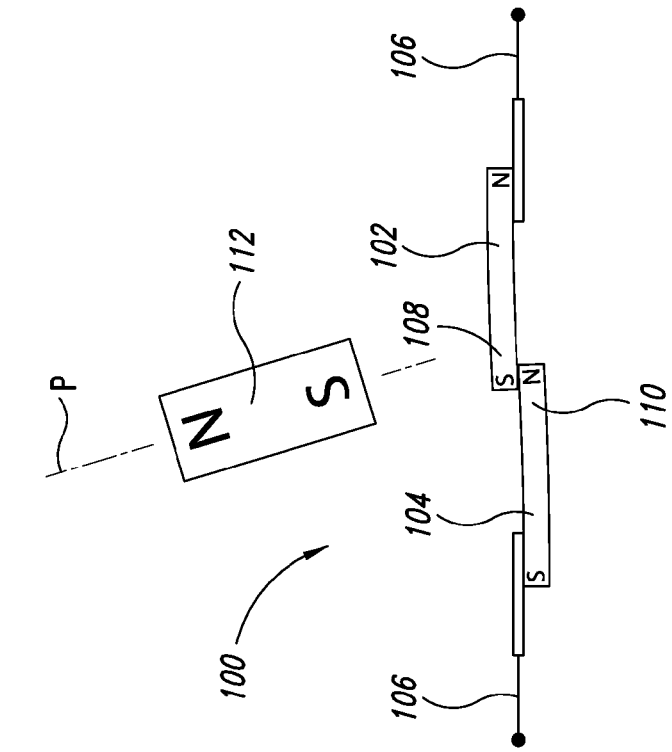
Figure 2B:
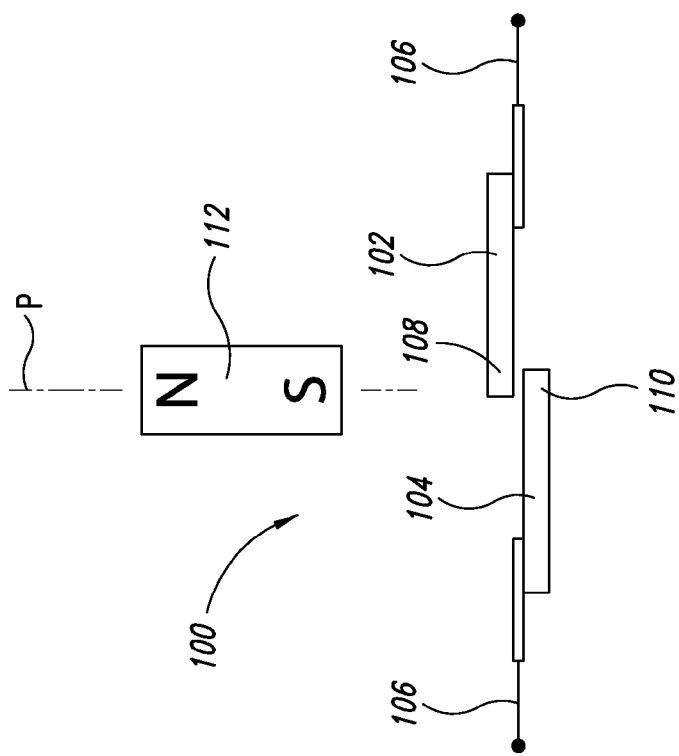
Figure 8:
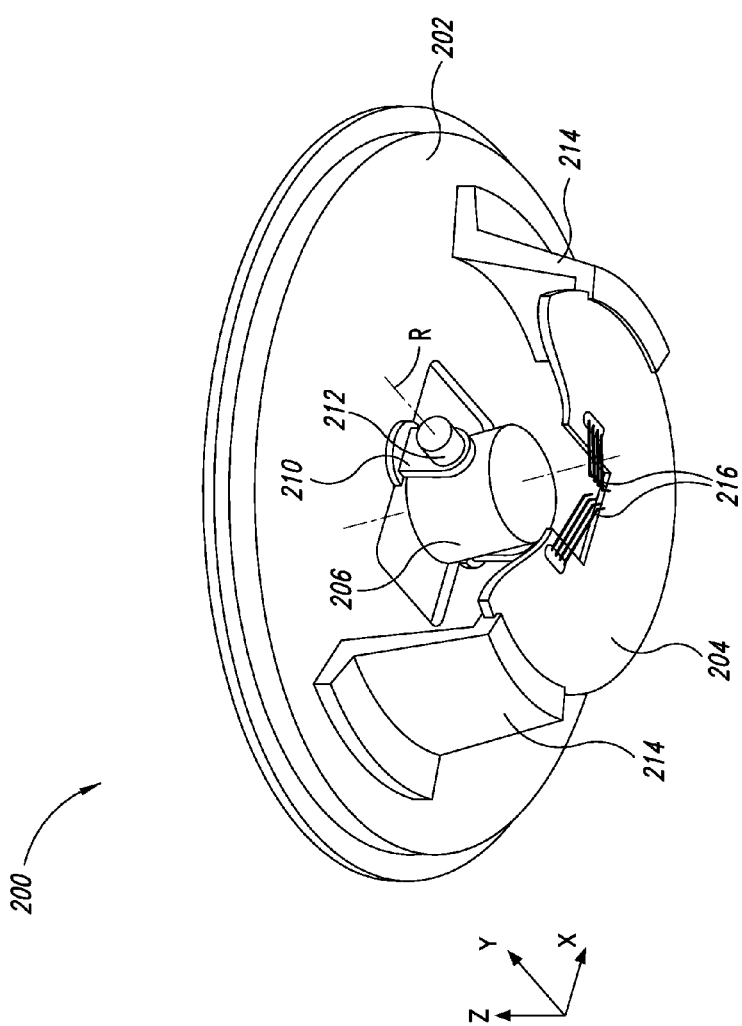
FIG. 8 shows a perspective view of a testing device for wafer level testing of magnetic switches, according to an embodiment of the invention.
Figure 9:
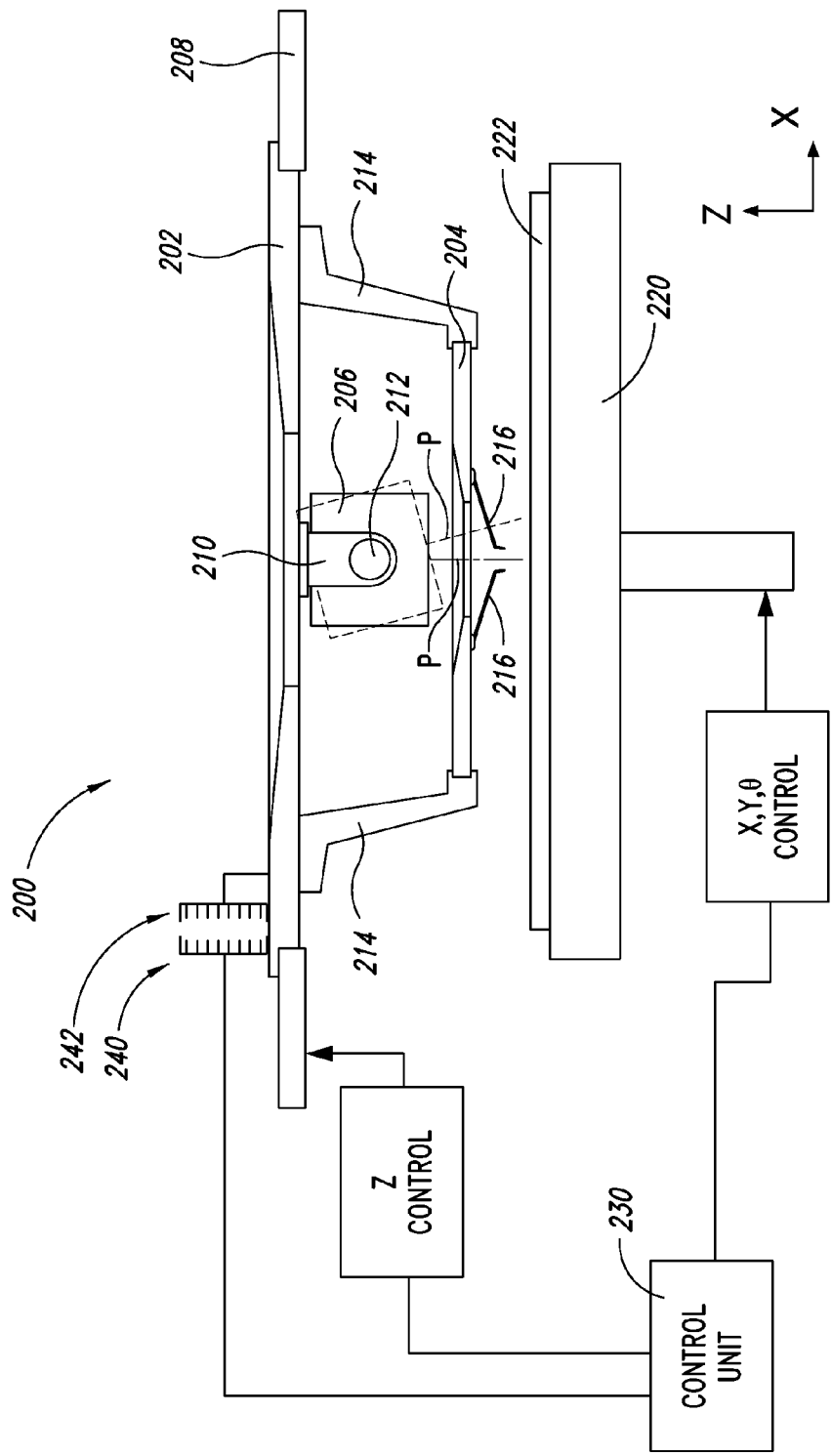
FIG. 9 shows the testing device of FIG. 8 in a partial cross section taken along the lines 9-9 of FIG. 8.

FIGS. 8 and 9 show a testing device 200 according to an embodiment of the invention. FIG. 8 shows a perspective view of the device 200 (shown partially cut away to more clearly show other elements), and FIG. 9 shows the testing device in a partial cross section.

Referring jointly to FIGS. 8 and 9, a wafer 222 is to be tested by the testing device 200. The testing device 200 comprises a fixture 202 and a probe card 204. The fixture 202 includes an electromagnetic field generator 206 coupled thereto. The field generator 206 includes a electromagnet that has a polar axis P, and is configured to be selectively rotatable around an axis R that lies perpendicular to the axis P and parallel to the Y axis. The fixture 202 is configured to be received by a probe ring 208 of a wafer prober, as shown in FIG. 9. The electromagnetic field generator 206 is supported by brackets 210 affixed to the fixture 202. A stepper motor 212 controls the angular position of the electromagnet field generator 206 with respect to the probe card 204.

The probe card 204 is supported below the fixture 202 by a pair of probe card brackets 214 so as to be held in a fixed position relative to the fixture. The probe card 204 and brackets 214 are configured to be separable so that a variety of different probe cards can be selectively coupled to the fixture, according to the configuration of the particular wafer to be tested. The probe card 204 includes a plurality of probe pins 216 coupled thereto, in positions selected to contact individual test probe contact points on a semiconductor wafer. The exact number of probe pins is determined, at least in part, by the number of switches to be tested simultaneously, as will be discussed later.

FIG. 9 also has a wafer chuck 220 with the semiconductor wafer 222 positioned thereon. The wafer chuck 220 and the probe ring 208 are components of a wafer prober machine such as is commonly used for wafer-level testing of semiconductor devices. Such a machine is typically configured to receive and interface with a wide variety of specialized probe cards, so as to be capable of testing many different semiconductor devices merely by coupling the required probe card to the probe ring, and providing the wafer prober with the appropriate programming.

The wafer chuck 220 is movable in the X and Y axes, and rotatable around an axis that lies perpendicular to the horizontal plane defined by the X and Y axes. The probe ring 208 is movable in the Z axis. The wafer prober includes a control unit 230 which controls movement of the chuck 220 and probe ring 208, and also includes electrical terminals 240 for electrically coupling the prober to a probe card. The testing device 200 includes a plurality of coupling terminals 242 configured to mate with the coupling terminals 240 of the wafer prober. The plurality of coupling terminals 242 includes: a pair of terminals that are coupled to the electromagnetic coil of the electromagnetic field generator 206, and by which the field generator is energized; leads of the stepper motor 212, by which the angular position of the electromagnet field generator 206 is controlled; and a plurality of leads coupled to respective ones of the probe pins 216, by which the testing device 200 and the control unit 230 can be coupled to individual switches on a semiconductor wafer.

Figure 10:
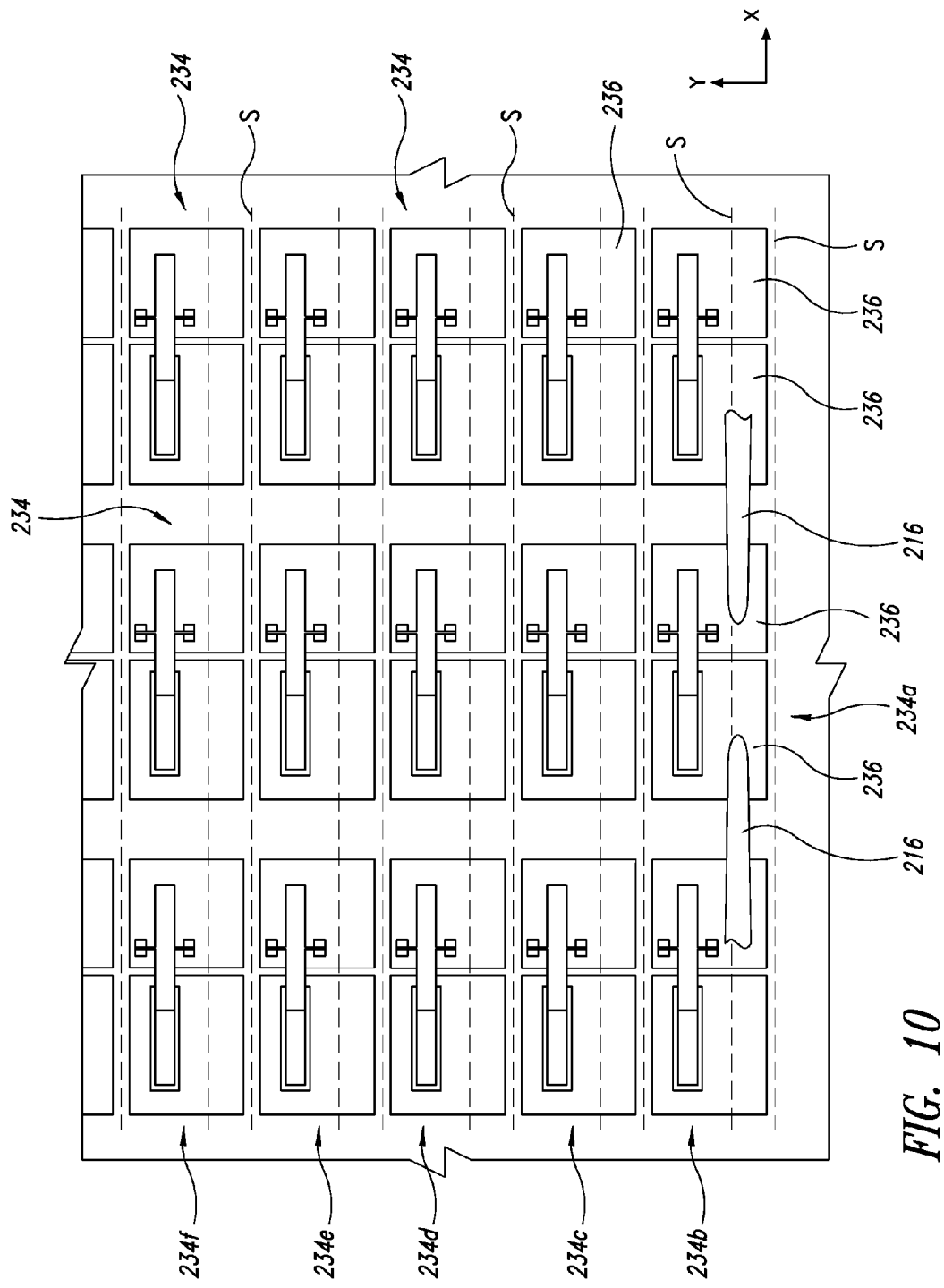
FIG. 10 show, in plan view, a plurality of magnetic switches positioned on a semiconductor wafer, according to an embodiment of the invention.

FIG. 10 shows a portion of the wafer 222 in plan view, showing magnetic switches 234 formed thereon, arranged in columns of switches having common longitudinal axes, and rows of switches lying in parallel columns. The magnetic switches 234 are structured similar to those described with reference to FIGS. 4-8, except that test probe contact points 236 are provided, to enable a secure contact by the probe pins 216 during wafer level testing. In the embodiment shown, the test probe contact points 236 are positioned between the scribe lines S of the wafer 222, which define the kerf that will be removed when the wafer is sawn into individual dice 180. Thus, the additional area of the test probe contact points 236 will require little or no net increase in the footprint of each device, and so may not reduce the number of devices that can be made on the wafer 222.

Magnetic switches are designed to actuate when exposed to a magnetic field of a specific strength, which is selected according to the requirements of a particular application. The field strength is a function of the strength of the magnet, the distance of the magnet from the switch, and the angle of the magnet's polar axis with respect to the longitudinal axis of the switch.

Figure 11:
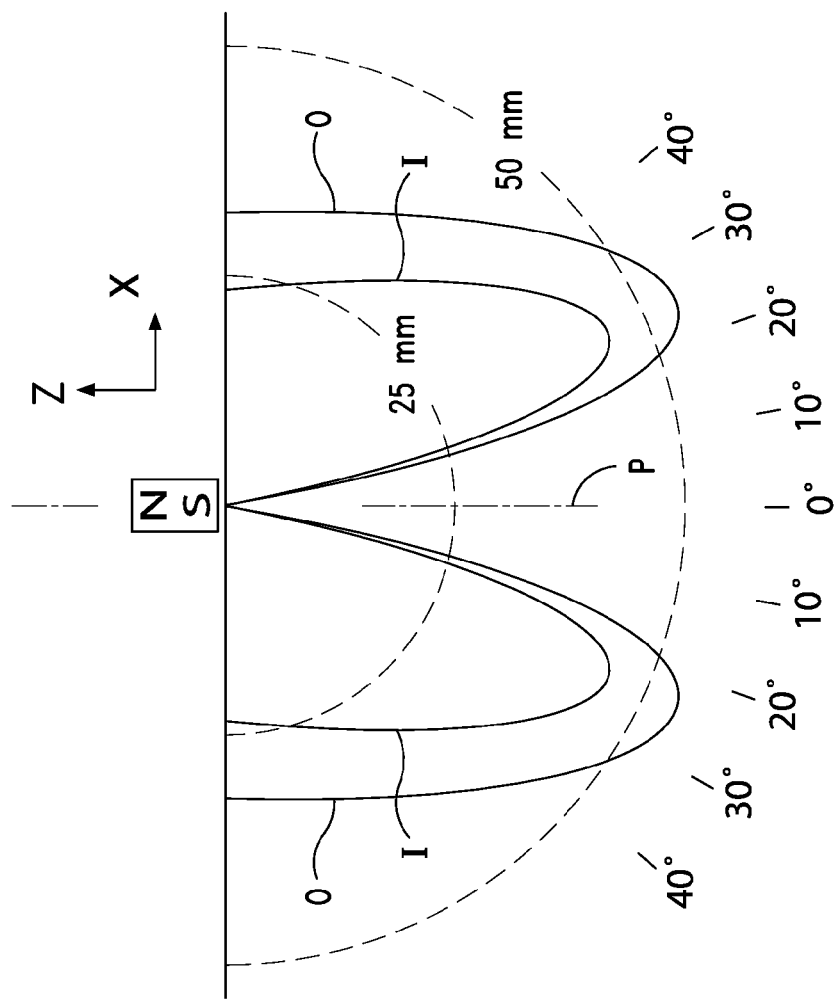
FIG. 11 shows a graph that depicts the response of an exemplary magnetic switch to a field generated by a magnet.

FIG. 11 shows a graph that depicts the response of an exemplary magnetic switch to a field generated by a magnet as the angle of the polar axis of the magnet changes, where the switch has a nominal switching angle of 14 degrees. While the magnet is positioned so that the switch is outside the outer lines O, the switch will not actuate; while the switch is inside the inner lines I, the switch will actuate; and while the switch is between the inner lines I and the outer lines O, the switch will remain unchanged from a previous condition. Thus— assuming the magnet is about 20-25 mm from the switch—as the magnet rotates from 0 degrees (i.e., perpendicular) through about 14 degrees, the switch will actuate, as it crosses an inner line I. As the magnet rotates back toward zero degrees, the switch will release at around 12 degrees, as it crosses an outer line O.

It will be recognized that if a magnet is positioned above a wafer with many switches formed thereon, the angle of the magnet relative to each of the switches will be different, according to the position of the particular switch on the wafer.

the number of switches that can be accurately tested simultaneously will be limited to a small number of switches that are close together. Additionally, that number may vary, depending upon the permissible tolerances for a given design. Thus, if the separation between devices on the wafer is equivalent to 4 degrees of arc, with respect to the rotational axis R of the electromagnetic field generator 206, and if the device under test must switch within one degree of its rated value, no more than one switch along the X axis can be tested at a time. On the other hand, if deviations from nominal of greater than two degrees are acceptable, it may be possible to test more than one switch simultaneously.

Operation of the testing device will be described hereafter with reference to an exemplary magnetic switch having a specific set of design parameters, e.g., magnetic switch 234a, as shown in FIG. 10. It will be recognized that, in practice, magnetic switches are designed and manufactured to meet a very wide range of applications, each of which has a particular set of parameters, and that those parameters will vary as widely as the applications. Thus, the parameters listed hereafter in describing the test procedures are merely illustrative. The testing device 200 can be adapted to accommodate many different design requirements. Usually, this accommodation is only a matter of modifying the program executed by the control unit.

In operation, the fixture 202 of the testing device 200 is coupled to the probe ring 208 of a wafer prober, with electrical leads from the electromagnetic field generator 206 and the probe card 204 coupled to the control unit 230. A semiconductor material wafer 222 is placed on the chuck 220, where it is held in place by suction. Using an optical alignment system, which is well known in the art, the control unit 230 adjusts the position of the chuck 220 in the X and Y axes and the angle of rotation θ, to align the wafer 222 under the probe card so that the probe pins 216 are positioned over the test probe contact points 236 of a first one of the switches 234, as shown in FIG. 10. The probe ring 208 is lowered until the probe pins 216 contact the test probe contact points 236 to electrically couple the switch 234 with the control unit 230.

FIG. 10 shows two test probes 216, which are in contact with the test probe contact points 236 of switch 234a. Alternatively, two probe pins 216 can be provided and positioned to contact each contact points 236. This increases the likelihood of a secure contact with the contact points and so reduces the occurrence of false error detection, or the need for retesting.

With the probe pins 216 positioned as shown in FIG. 10, the test of the magnetic switch 234a is executed. First, with the polar angle of the electromagnetic field generator 206 at an angle that is at least equal to, and preferably greater than, the minimum effective switching angle for the particular switch design, the field generator is energized in a series of pulses. This causes the switch to open and close several times, which scrubs away debris or material that may have been left on the conductive layers between the contact plates of the switch 234 during the manufacturing process. After this first step, the remaining test procedures are not limited to a specific order, although there may be some benefit in performing some tests before, during, or after other tests.

In a first parametric test, the field generator 206 is positioned at the rated switching angle of the switch, e.g., 13 degrees, and provided with a current of 250 mA, to produce a magnetic field equal to the rated field strength. The current is switched on and off at a pulse rate of 1 Hz, and a potential of 20 mV is applied across the contact points of the switch 236a. A resulting pulsed current through the switch is detected, indicating that the switch actuates at the rated field strength and angle, and at the rated frequency. Current flow across the contact points is measured while the switch is closed to determine its closed circuit contact resistance, and while the switch is open to determine its open circuit contact resistance. Time lags between formation of the magnetic field and switch actuation, and between collapse of the field and switch release, are measured to determine response time to open and close.

Next, a ramping current is applied to the field generator 206, rising from zero to 250 mA, while a potential is maintaining across the contact points. As current rises, resistance across the contact points is monitored. From the current level at which resistance drops below the rated closed circuit contact resistance, the switch's minimum field strength for switching can be derived. After the switch closes, the ramp is reversed, so that the current is reduced back to zero. From the current level at which the resistance rises above the rated open circuit contact resistance, the switch's hysteresis value can be derived.

Because field strength and magnet angle are correlated, the ramping current procedure discussed above can in some cases also be used to determine the minimum effective switching angle of the switch. Alternatively, the field generator 206 is moved to a zero angle, then, while producing the appropriate field strength, rotated away from zero until the switch closes, to determine the minimum effective switching angle.

After the test is complete, the probe ring 208 is raised, which lifts the probe pins 216 from the surface of the wafer 222. Contact by probe pins 216 with contact points 236 leaves distinct marks when the probe pins are removed. Not only can the precise positions of contact be determined from the marks, but also whether sufficient pressure was applied to establish a full connection. Therefore, a final test is to examine the contact points 236 to confirm that the probe pins were correctly coupled while testing was performed. In particular with respect to switches that have failed to meet nominal parameters, a final inspection of the contact terminals may show that the failure was a probe pin positioning failure, rather than a manufacturing defect of the device.

According to one embodiment, if a switch fails to meet one of the test parameters, the remaining tests for that switch are omitted, and the position of the failed switch is noted, so that the switch can be discarded once the wafer is singulated. As testing of the switches of one or a number of wafers proceeds, it may be determined that the switches of a particular production run tend to fail to meet a required value for one design parameter more frequently than the remaining parameters. In such a case, the order in which the tests are performed on the remaining switches may be modified so that that one parameter is tested early in the series. Thus, a bad switch will be more likely to fail early in the process, reducing the time spent testing bad switches.

According to another embodiment, the test is continued, even if a switch fails to meet certain ones of the parameters. For example, if a switch fails to close at a rated angle of 13 degrees, the angle of the field generator is increased until the switch closes, or it becomes clear it will not close. If the switch closes at 20 degrees, this value is logged, and when the switch is singulated and packaged, it is re-rated to close at 20 degrees. The manufacturer can thereafter sell that switch to a customer that requires a switch rated at 20 degrees. Other parameters, such as field strength and open and closed circuit contact resistance can likewise be measured, and the switch re-rated, where the switch fails to meet the original rated values.

Preferably, most or all of the operations are performed automatically by a wafer prober, as directed by its programming. This is especially true with respect to production runs in which large numbers of switches are manufactured and tested. Such programming is within the abilities of one having ordinary skill in the art. On the other hand, any of the procedures can be performed manually or under direct control of a testing machine by an operator. In particular, this may be preferable in research and development applications.

According to an embodiment, the electromagnetic field generator 206 is gimbaled, so as to be rotatable around the axis R, as described above, and also around a second axis, perpendicular to the axis R and parallel to the X axis. Additionally, the probe card 204 is configured to couple with a plurality of switches that lie in a common row, e.g., switches 234b-234f. The field generator 206 is positioned for testing one of the switches in the row, e.g., switch 234b, and the switch is tested as described above. Following completion of the testing, the field generator 206 is rotated around the second axis until its polar axis P is substantially aligned a longitudinal axis of the next switch in the row, whereupon the test is repeated. This procedure is repeated for each of the plurality of switches. In this way, a larger number of switches is tested each time the probe card 204 is positioned, and the probe card is repositioned fewer times during testing of all of the switches of the wafer. Alternatively, if groups of more than one switch in a given row are tested simultaneously, the field generator 206 is rotated around the second axis until its polar axis P is substantially aligned midway between the longitudinal axes of the first and last switches of the next group of switches that are to be tested.

Figure 12:
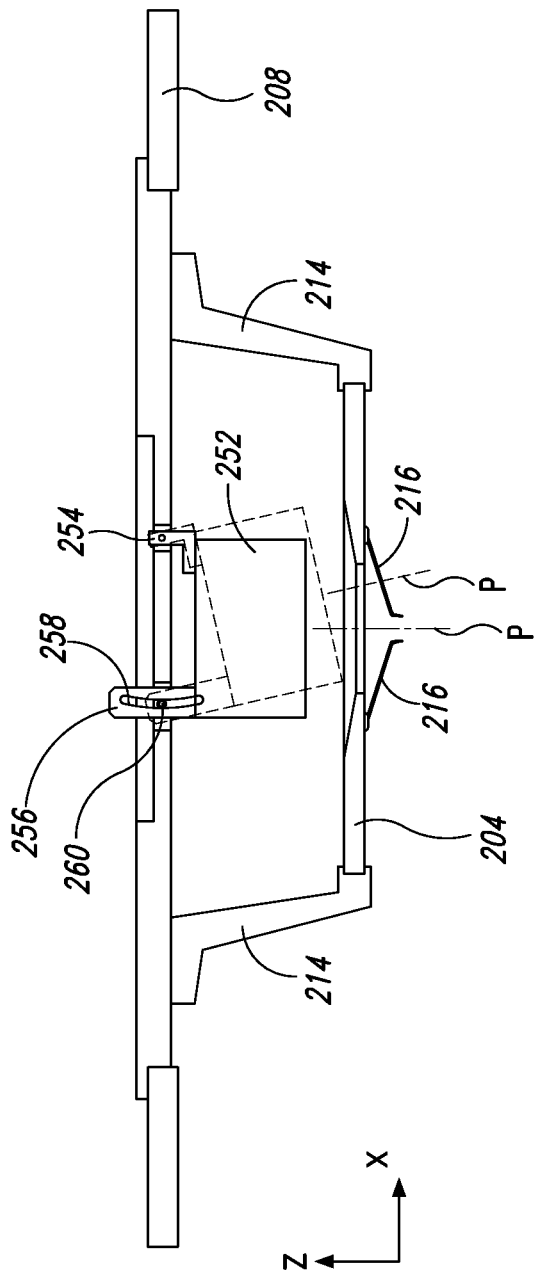
FIG. 12 shows a testing device for wafer level testing of magnetic switches, according to another embodiment of the invention.

Turning now to FIG. 12, a testing fixture 250 is shown, in accordance with another embodiment. The fixture 250 is similar in most respects to the fixture 202 described with reference to FIGS. 8 and 9. However, the electromagnetic field generator 252 is coupled to the fixture 250 by a hinge 254 and a bracket 256. The bracket 256 includes a slot 258 which is traversed by a pin 260 that is coupled to the fixture 250. Rotation of the field generator 252 on the hinge 254 is constrained to a range by travel of the pin 260 in the slot 258. As shown in FIG. 12, rotation is limited to a range between zero degrees and 13 degrees, shown in dotted lines. According to other embodiments, the bracket 256 is configured to permit rotation to larger angles, and is provided with detents at selected angles so the field generator can be rotated to one of the selected angles and will hold itself at that angle until it is moved to a different angle.

In operation, a user moves the field generator to a selected angle, where it remains for the duration of a wafer test series. It is not always necessary to measure the minimum effective switching angle of a switch, but only to confirm actuation at the rated angle. Thus, it is not essential that the magnet be rotatable during a test.

Testing of a magnetic switch has been described with reference to a particular series of examples of test procedures. The specific parameters are exemplary, as are the procedures themselves. In practice, a wafer level test of one or a plurality of magnetic switches can include any, all, or none of the procedures described above, and can also include procedures not described above. Accordingly, the claims are not limited by the procedures described, except where specifically recited.

Embodiments have been described with reference to a wafer prober, a probe ring, and a wafer chuck. These devices are among a wide range of devices that are commercially available for examining and testing wafers. In many cases, substantially identical devices are known by different names, and in other cases, devices having distinct appearances and operation overlap in function to the extent that they can perform some or all of the functions described above with reference to a wafer prober, a probe ring, and a wafer chuck. Accordingly, these terms are to be considered generic, and are to be construed broadly to refer to any device or system that operates in the manner described. In particular, any device, or combination of devices intended to be used together, that incorporate means for supporting a wafer, means for interchangeably receiving and supporting a variety of specialized equipment related to testing or examining the wafer, and means for precisely positioning the wafer and the specialized equipment relative to each other are considered equivalent to the wafer prober, the wafer chuck, and the probe ring described below.

Where a claim limitation recites a structure as an object of the limitation, that structure itself is not an element of the claim, but is a modifier of the subject. For example, in a limitation that recites "a plurality of probe pins configured to make contact with respective terminals of a wafer of semiconductor material," the wafer is not an element of the claim, but instead serves to define the scope of the term probe pins. Additionally, subsequent limitations or claims that recite or characterize additional elements relative to the wafer do not render the wafer an element of the claim.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a fixture configured to be received in a probe ring;
a probe card rigidly coupled to the fixture;
a plurality of probe pins coupled at respective first ends to the probe card, and configured to make electrical contact, at respective second ends, with respective contact terminals of a wafer of semiconductor material; and
an electromagnetic field generator coupled to the fixture, positioned and configured to selectably generate a magnetic field at any of a plurality of field angles, relative to the wafer, for inducing actuation of magnetic devices formed on the wafer.

2. The device of claim 1 wherein the electromagnetic field generator is rotatable around an axis that is perpendicular to a polar axis of a magnetic field generated thereby.

3. The device of claim 2 wherein a range of rotation of the electromagnetic field generator includes a position in which the polar axis lies perpendicular to a surface of the probe card.

4. The device of claim 2, comprising a stepper motor coupled to the electromagnetic field generator and configured to control an angle of the field generator relative to the surface of the probe card.

5. The device of claim 1, comprising:
a wafer prober to which the probe ring is coupled;
a wafer chuck coupled to the wafer prober and configured to hold the wafer for contact with the plurality of probe pins; and
a control unit of the wafer prober, configured to control the relative positions of the wafer chuck and the probe ring.

6. The device of claim 1, comprising:
a control unit electrically coupled to the electromagnetic field generator and each of the plurality of probe pins and configured to:
selectively apply a potential across terminals of the electromagnetic field generator,
selectively apply a potential across a first pair of the plurality of electrical probes in electrical contact with respective contact terminals of the wafer, and
detect changes in impedance across the contact terminals of the wafer.

7. The device of claim 6 wherein the control unit is configured to selectively apply a potential across each of a plurality of pairs of the plurality of probe pins in electrical contact with respective contact terminals of the wafer, and to detect respective changes in impedance across the contact terminals in electrical contact with each of the plurality of pairs of electrical probes.

8. The device of claim 6 wherein the control unit is configured to measure a contact resistance across a switch on the wafer.

9. The device of claim 6 wherein the control unit is configured to measure a response time of a switch on the wafer to activation of the electromagnetic field generator.

10. The device of claim 6 wherein the control unit is configured to detect a response of a switch on the wafer to a magnetic field generated by the electromagnetic field generator.

11. The device of claim 6 wherein the control unit is configured to detect a response of a switch on the wafer to a magnetic field generated by the electromagnetic field generator at each of a plurality of field angles.

12. A method of testing a microelectromechanical device, comprising:
placing each of a plurality of probes in electrical contact with respective ones of a plurality of contact terminals of a wafer of semiconductor material on which is formed a plurality of magnetically actuable microelectromechanical devices;
selecting one of a plurality of angles at which an electromagnetic field generator is configurable to generate a magnetic field;
generating a magnetic field adjacent to the wafer and extending to include a portion of the wafer by energizing the electromagnetic generator at the selected angle, the selected angle being relative to a plane defined by an upper surface of the wafer; and
monitoring one of the plurality of microelectromechanical devices for a response to the magnetic field.

13. The method of claim 12, comprising:
removing each of the plurality of probes from electrical contact with the respective ones of the plurality of contact terminals of the wafer;
placing each of the plurality of probes in electrical contact with another respective one of the plurality of contact terminals of the wafer;

repeating the step of generating a magnetic field; and
monitoring another one of the plurality of microelectromechanical devices.

14. The method of claim 12, comprising monitoring each of the plurality of microelectromechanical devices for a response to the magnetic field, including the steps of monitoring the ones of the plurality of microelectromechanical devices.

15. The method of claim 12 wherein generating the magnetic field comprises generating the magnetic field at more than one of the plurality of angles, relative to the plane, at which the electromagnetic field generator is configurable to generate a magnetic field.

16. The method of claim 15 wherein generating the magnetic field at more than one of the plurality of angles comprises rotating the electromagnetic field generator to each of a plurality of selected angles relative to the plane.

17. The method of claim 12 wherein monitoring for a response comprises monitoring the one of the plurality of microelectromechanical devices for a response to the magnetic field at each of a plurality of selected angles, relative to the plane.

18. The method of claim 12 wherein each of the plurality of microelectromechanical devices is one of a plurality of magnetically actuatable switches, the method further comprising:
measuring an open circuit contact resistance of one of the plurality of magnetically actuatable switches; and
measuring a closed circuit contact resistance of one of the plurality of magnetically actuatable switches.

19. The method of claim 18, further comprising:
measuring a minimum field strength for actuation of one of the plurality of magnetically actuatable switches; and
confirming a minimum current capacity of one of the plurality of magnetically actuatable switches.

20. The method of claim 12 wherein monitoring for a response comprises:
measuring a response time of the one of the plurality of microelectromechanical devices to the magnetic field;
detecting a response of the one of the plurality of microelectromechanical devices to switching of the magnetic field; and
detecting critical dimensions of the one of the plurality of microelectromechanical devices with respect to angles of the magnetic field.

21. The method of claim 12, comprising, packaging only ones of the plurality of microelectromechanical devices that meet preselected criteria as determined in the step of monitoring for a response.

22. A device, comprising:
a fixture configured to be received in a probe ring;
a probe card rigidly coupled to the fixture;
a plurality of probe pins coupled at respective first ends to the probe card, and configured to make electrical contact, at respective second ends, with respective contact terminals of a wafer of semiconductor material; and
an electromagnetic field generator coupled to the fixture, positioned and configured to generate a magnetic field for inducing actuation of magnetic devices formed on the wafer, the electromagnetic field generator being rotatable around an axis that is perpendicular to a polar axis of a magnetic field generated thereby.

23. The device of claim 22, wherein electromagnetic field generator includes a position in which the polar axis lies perpendicular to a surface of the probe card.

24. A device, comprising:
a fixture configured to be received in a probe ring;
a probe card rigidly coupled to the fixture;
a plurality of probe pins coupled at respective first ends to the probe card, and configured to make electrical contact, at respective second ends, with respective contact terminals of a wafer of semiconductor material;
an electromagnetic field generator coupled to the fixture, positioned and configured to generate a magnetic field at any of a plurality of field angles, relative to the wafer, for inducing actuation of magnetic devices formed on the wafer; and
a control unit electrically coupled to the electromagnetic field generator and each of the plurality of probe pins and configured to detect a response of a switch on the wafer to the magnetic field generated by the electromagnetic field generator at each of a plurality of field angles.

25. The device of claim 24, wherein the electromagnetic field generator is rotatable around an axis that is perpendicular to a polar axis of the magnetic field generated thereby.

26. A method of testing a microelectromechanical device, comprising:
placing each of a plurality of probes in electrical contact with respective ones of a plurality of contact terminals of a wafer of semiconductor material on which is formed a plurality of magnetically actuable microelectromechanical devices;
generating a magnetic field adjacent to the wafer and extending to include a portion of the wafer, the magnetic field being relative to each of a plurality of selected angles relative to a plane defined by an upper surface of the wafer; and
monitoring one of the plurality of microelectromechanical devices for a response to the magnetic field.

27. The method of claim 26, wherein generating a magnetic field comprises generating the magnetic field at each of a plurality of selected angles relative to the plane.

28. A method of testing a microelectromechanical device, comprising:
placing each of a plurality of probes in electrical contact with respective ones of a plurality of contact terminals of a wafer of semiconductor material on which is formed a plurality of magnetically actuable microelectromechanical devices;
generating a magnetic field adjacent to the wafer and extending to include a portion of the wafer, the magnetic field being at a selected angle relative to a plane defined by an upper surface of the wafer; and
monitoring one of the plurality of microelectromechanical devices for a response to the magnetic field at each of a plurality of angles, relative to the plane.

29. The method of claim 28, comprising measuring an open circuit contact resistance of the one of the plurality of magnetically actuatable switches.

30. A method of testing a microelectromechanical device, comprising:
placing each of a plurality of probes in electrical contact with respective ones of a plurality of contact terminals of a wafer of semiconductor material on which is formed a plurality of magnetically actuable switches;
generating a magnetic field adjacent to the wafer and extending to include a portion of the wafer, the field being at a selected angle relative to a plane defined by an upper surface of the wafer; and
monitoring one of the plurality of magnetically actuatable switches for a response to the magnetic field, including:
measuring an open circuit contact resistance of the one of the plurality of magnetically actuatable switches; and
measuring a closed circuit contact resistance of the one of the plurality of magnetically actuatable switches.

31. The method of claim 30, comprising:

measuring a minimum field strength for actuation of one of the plurality of magnetically actuatable switches; and confirming a minimum current capacity of one of the plurality of magnetically actuatable switches.

32. A method of testing a microelectromechanical device, comprising:

placing each of a plurality of probes in electrical contact with respective ones of a plurality of contact terminals of a wafer of semiconductor material on which is formed a plurality of magnetically actuable microelectromechanical devices;

generating a magnetic field adjacent to the wafer and extending to include a portion of the wafer, the field being at a selected angle relative to a plane defined by an upper surface of the wafer; and monitoring one of the plurality of microelectromechanical devices for a response to the magnetic field, including:

measuring a response time of the one of the plurality of microelectromechanical devices to the magnetic field;

detecting a response of the one of the plurality of microelectromechanical devices to switching of the magnetic field; and detecting critical dimensions of the one of the plurality of microelectromechanical devices with respect to angles of the magnetic field.

33. The method of claim 32, wherein:

the selected angle is one of a plurality of angles at which an electromagnetic field generator is configured to generate a magnetic field; and the generating the magnetic field includes energizing the electromagnetic field generator at the selected angle.

\* \* \* \* \*